US012772917B2

(12) United States Patent
Hsiao et al.

(10) Patent No.: US 12,772,917 B2
(45) Date of Patent: Oct. 20, 2026

(54) DRIVING DEVICE

(71) Applicant: ACTRON TECHNOLOGY CORPORATION, Taoyuan City (TW)

(72) Inventors: Pen-Hung Hsiao, Taoyuan City (TW); Wei-Jung Chen, Taoyuan City (TW)

(73) Assignee: ACTRON TECHNOLOGY CORPORATION, Taoyuan City (TW)

( * ) Notice: Subject to any disclaimer, the term of this patent is extended or adjusted under 35 U.S.C. 154(b) by 359 days.

(21) Appl. No.: 18/639,615

(22) Filed: Apr. 18, 2024

(65) Prior Publication Data

US 2025/0192009 A1 Jun. 12, 2025

(30) Foreign Application Priority Data

Dec. 7, 2023 (TW) ................................ 112147678

(51) Int. Cl.
*H10W 90/00* (2026.01)
*H10W 70/40* (2026.01)

(52) U.S. Cl.
CPC ........ *H10W 90/811* (2026.01); *H10W 70/411* (2026.01); *H10W 70/465* (2026.01); *H10W 70/481* (2026.01); *H10W 90/753* (2026.01)

(58) Field of Classification Search
None
See application file for complete search history.

(56) References Cited

U.S. PATENT DOCUMENTS 11,476,183 B2 10/2022 Imanishi
2017/0104474 A1* 4/2017 Kanda ..................... H02P 27/06
2017/0170819 A1* 6/2017 Kanda ................ H03K 17/0822
2021/0351114 A1* 11/2021 Imanishi ............. H10W 70/411

FOREIGN PATENT DOCUMENTS

TW 201338113 A 9/2013
TW 201614796 A 4/2016
TW 201826657 A 7/2018

OTHER PUBLICATIONS

Taiwanese Search Report for Taiwanese Application No. TW112147678, dated Jun. 26, 2024, with English translation.

* cited by examiner

*Primary Examiner* — Sue A Purvis
*Assistant Examiner* — Jordan M Klein
(74) *Attorney, Agent, or Firm* — Birch, Stewart, Kolasch & Birch, LLP

(57) ABSTRACT

A driving device includes a lead frame, a plurality of high-side driving modules, at least one low-side driving module, a plurality of high-side switching modules, a plurality of low-side switching modules, and an outer package. The lead frame has a plurality of high-side driving regions, at least one low-side driving region, a plurality of high-side switching regions, and a plurality of low-side switching regions. The high-side driving modules are respectively disposed in the high-side driving regions. Each of the high-side driving modules includes a built-in package, a primary-side circuit, a drive-side circuit, and a bootstrap diode. The built-in package packages the primary-side circuit, the drive-side circuit, and the bootstrap diode. The built-in package has a bottom surface. The bottom surface is provided with a plurality of leads. The leads are electrically connected to the primary-side circuit, the drive-side circuit, and the bootstrap diode.

11 Claims, 6 Drawing Sheets

DRIVING DEVICE

BACKGROUND OF THE INVENTION

Technical Field

The present invention relates generally to a driving device, and more particularly to a driving device with a built-in package.

Description of Related Art

A power module of a conventional driving device is connected to a three-phase motor to drive the three-phase motor. For example, the U.S. Pat. No. 11,476,183B2 discloses a "Semiconductor package", wherein a power module is constituted of a plurality of driving circuits 3a, 3b, 3c, 4a, 4b, 4c and a plurality of switching units 1a, 1b, 1c, 1d, 1e, 1f. The driving circuits 3a, 3b, 3c, 4a, 4b, 4c include three high-side driving circuits 3a, 3b, 3c and three low-side driving circuits 4a, 4b, 4c. The switching units 1a, 1b, 1c, 1d, 1e, 1f include three high-side switching units 1a, 1b, 1c and three low-side switching units 1d, 1e, 1f. By the packaging technique of package in package (PiP), the three high-side driving circuits 3a, 3b, 3c are packaged in a built-in package 5 to form a high-side driving unit that is monolithic. The high-side driving unit is connected to the high-side switching units 1a, 1b, 1c through a plurality of wires 7a, 7b, 7c by bonding. Then the power module is packaged by an outer package 8.

The built-in package 5 could simultaneously package the three high-side driving circuits 3a, 3b, 3c. The high-side driving unit packaged by the built-in package 5 could be inspected in advance. However, when any one of the high-side driving circuits 3a, 3b, 3c of the high-side driving unit is found malfunctioned during inspection, the entire high-side driving unit packaged by the built-in package 5 is required to be replaced even if the other two high-side driving circuits 3a, 3b, 3c function properly, so that the overall cost is increased Moreover, as three high-side driving circuits 3a, 3b, 3c of the high-side driving unit are integrally packaged, the yield rate of packaging is decreased and the packaging time is increased.

Therefore, the conventional driving module still has room for improvement. How to reduce the cost due to malfunction and increase the yield rate, has become a major issue in the industry.

BRIEF SUMMARY OF THE INVENTION

In view of the above, the primary objective of the present invention is to provide a driving device, which could reduce a cost due to malfunction and increase a yield rate.

The present invention provides a driving device, including a lead frame, a plurality of high-side driving modules, at least one low-side driving module, a plurality of high-side switching modules, a plurality of low-side switching modules, and an outer package. The lead frame has a plurality of high-side driving regions, at least one low-side driving region, a plurality of high-side switching regions, and a plurality of low-side switching regions. The high-side driving modules are respectively disposed in the high-side driving regions of the lead frame. Each of the high-side driving modules includes a built-in package, a primary-side circuit, a drive-side circuit, and a bootstrap diode. The built-in package packages the primary-side circuit, the drive-side circuit, and the bootstrap diode. The built-in package has a top surface and a bottom surface. The bottom surface is provided with a plurality of leads. The leads are electrically connected to the primary-side circuit, the drive-side circuit, and the bootstrap diode. The bottom surface of each of the high-side driving modules faces each of the high-side driving regions of the lead frame. The leads of each of the high-side driving modules are welded to each of the high-side driving regions of the lead frame. The at least one low-side driving module is disposed in the at least one low-side driving region of the lead frame. The high-side switching modules are respectively disposed in the high-side switching regions of the lead frame. Each of the high-side switching modules are electrically connected to each of the high-side driving modules through the lead frame. The low-side switching modules are respectively disposed in the low-side switching regions of the lead frame. The low-side switching modules are electrically connected to the at least one low-side driving module through the lead frame. The outer package packages the high-side driving modules, the at least one low-side driving module, the high-side switching modules, the low-side switching modules, and the lead frame.

With the aforementioned design, each of the high-side driving modules includes the built-in package to package the primary-side circuit, the drive-side circuit, and the bootstrap diode, so that each of the high-side driving modules forms an individual component. In this way, before the outer package packages, each of the high-side driving modules could be inspected in advance for troubleshooting. If any one of the high-side driving modules is found malfunctioned during inspection, only the malfunctioned high-side driving module that is packaged is required to be replaced, thereby reducing the cost due to malfunction. Moreover, as each of the high-side driving modules forms an individual component, the problem of the conventional power module that the yield rate of packaging is decreased and the packaging time is increased by integrally packaging three high-side driving circuits could be relieved.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
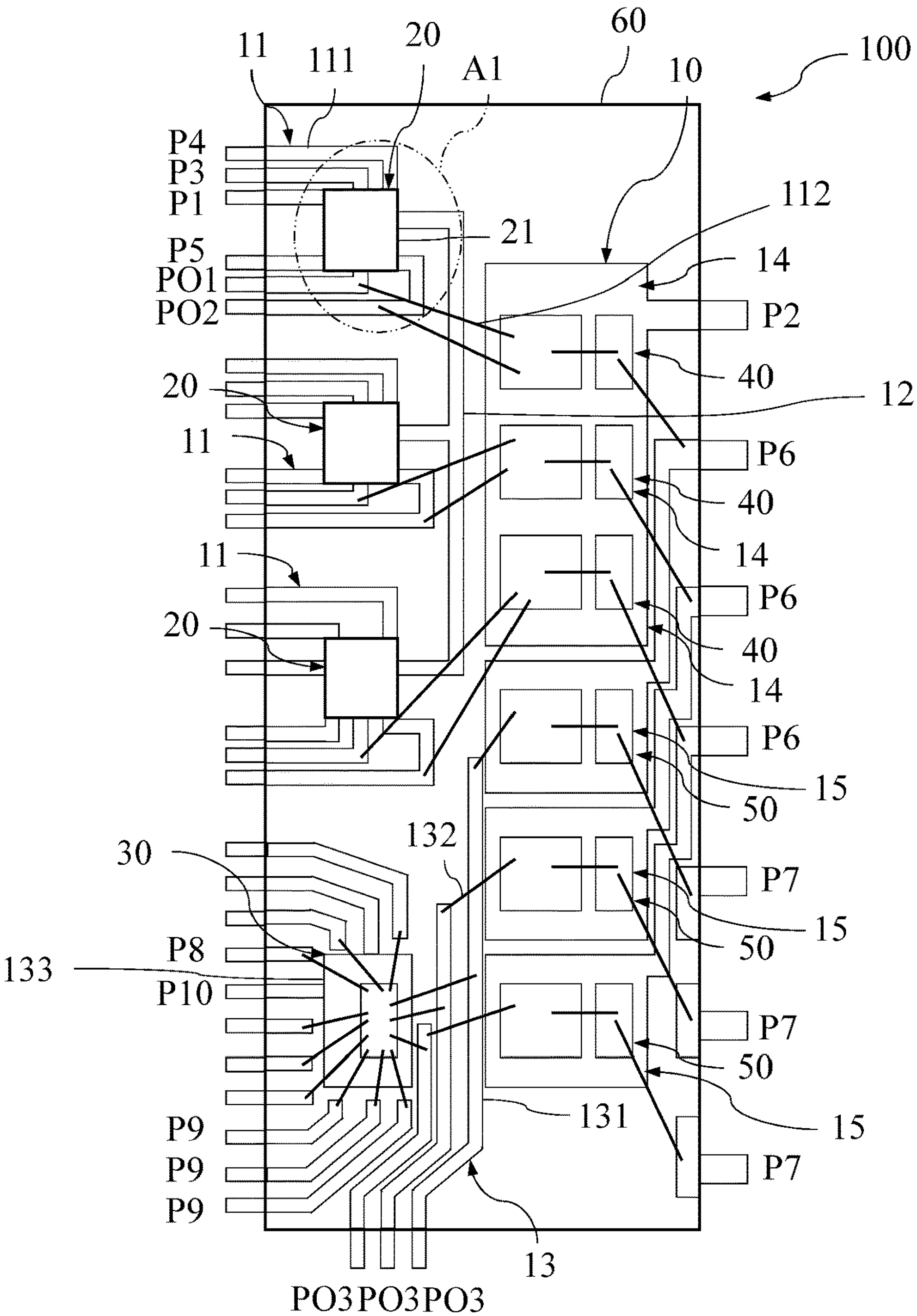
FIG. 1 is a schematic view showing the package structure of the driving device according to an embodiment of the present invention.
Figure 2:
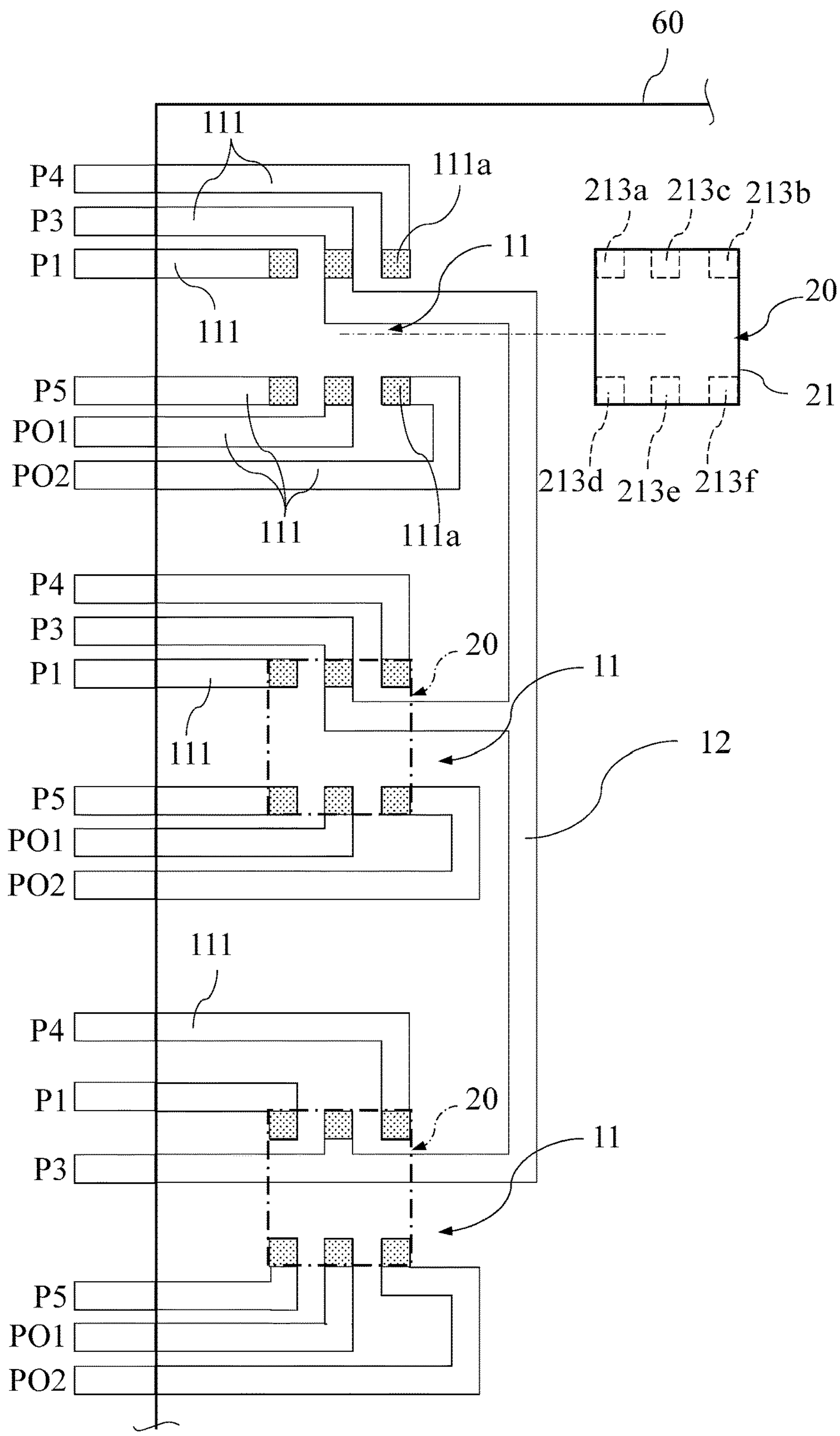
FIG. 2 is a schematic view of the high-side driving region of the driving device according to the embodiment of the present invention.

A driving device 100 according to an embodiment of the present invention is illustrated in FIG. 1 and FIG. 2 and includes a lead frame 10, a plurality of high-side driving modules 20, at least one low-side driving module 30, a plurality of high-side switching modules 40, a plurality of low-side switching modules 50, and an outer package 60. In the current embodiment, the number of the high-side driving modules 20, the number of the high-side switching modules 40, and the number of the low-side switching module 50 are respectively three, but not limited thereto. The high-side driving modules 20, the high-side switching modules 40, and the low-side switching module 50 are adapted to drive a motor, for example, a three-phase motor 200.

The lead frame 10 has a plurality of high-side driving regions 11, a connection linkage 12, at least one low-side driving region 13, a plurality of high-side switching regions 14, and a plurality of low-side switching regions 15. The high-side driving regions 11 and the high-side switching regions 14 are arranged side by side. The at least one low-side driving region 13 and the low-side switching regions 15 are arranged side by side. In the current embodiment, the number of the high-side driving regions 11 is three to correspond to three high-side driving modules 20, and the number of the at least one low-side driving region 13 is one to correspond to one low-side driving module 30, but not limited thereto.

Each of the high-side driving regions 11 includes a plurality of high-side linkages 111, wherein the high-side linkage 111 are arranged at intervals. Each of the high-side linkages 111 has a contact 111*a*, wherein the contact 111*a* is located on a terminal of the high-side linkage 111. The connection linkage 12 is located between the high-side driving regions 11 and the high-side switching regions 14. One of the high-side linkages 111 of each of the high-side driving regions 11 is connected to the connection linkage 12. In the current embodiment, each of the high-side switching modules 40 is connected to two of the high-side linkages 111 of each of the high-side driving regions 11 through two high-side metal wires 112 in a manner of wire bonding.

The low-side driving region 13 includes a plurality of low-side linkages 131 and at least one die pad 133. In the current embodiment, the number of the at least one die pad 133 is one, but not limited thereto. The low-side linkages 131 are arranged at intervals. The low-side driving module 30 is disposed on the die pad 133. The low-side driving module 30 are respectively connected to the low-side switching modules 50 and the low-side linkages 131 through a plurality of low-side metal wires 132 in a manner of wire bonding.

Figure 3:
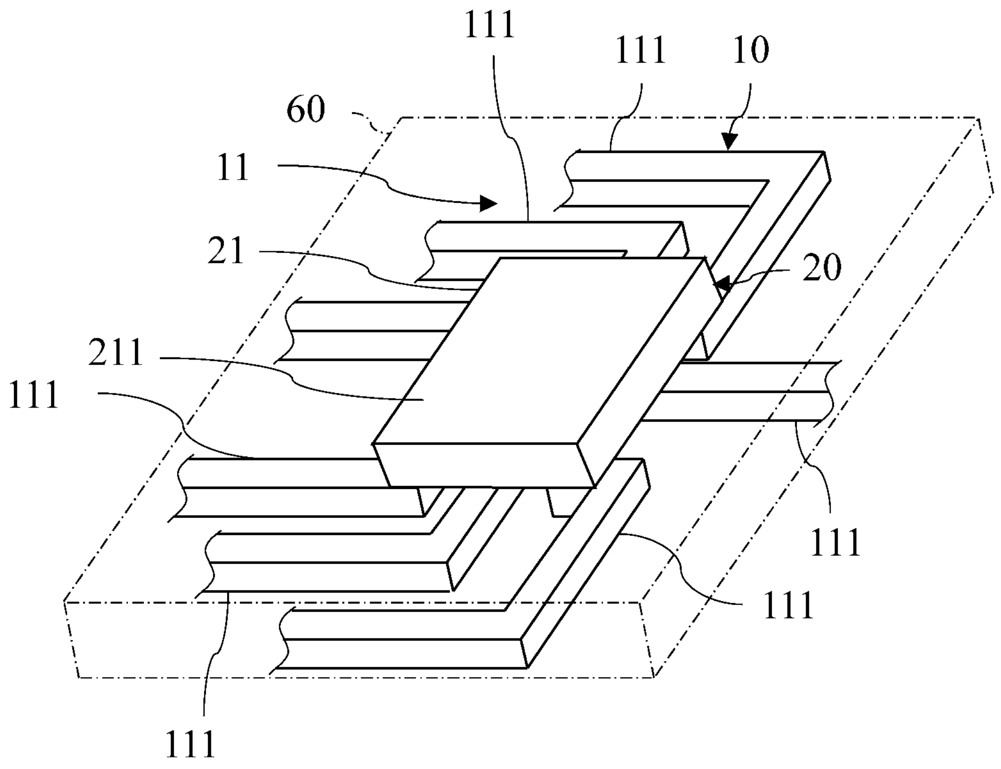
FIG. 3 is a perspective view of a marked region A1 in FIG. 1.
Figure 4:
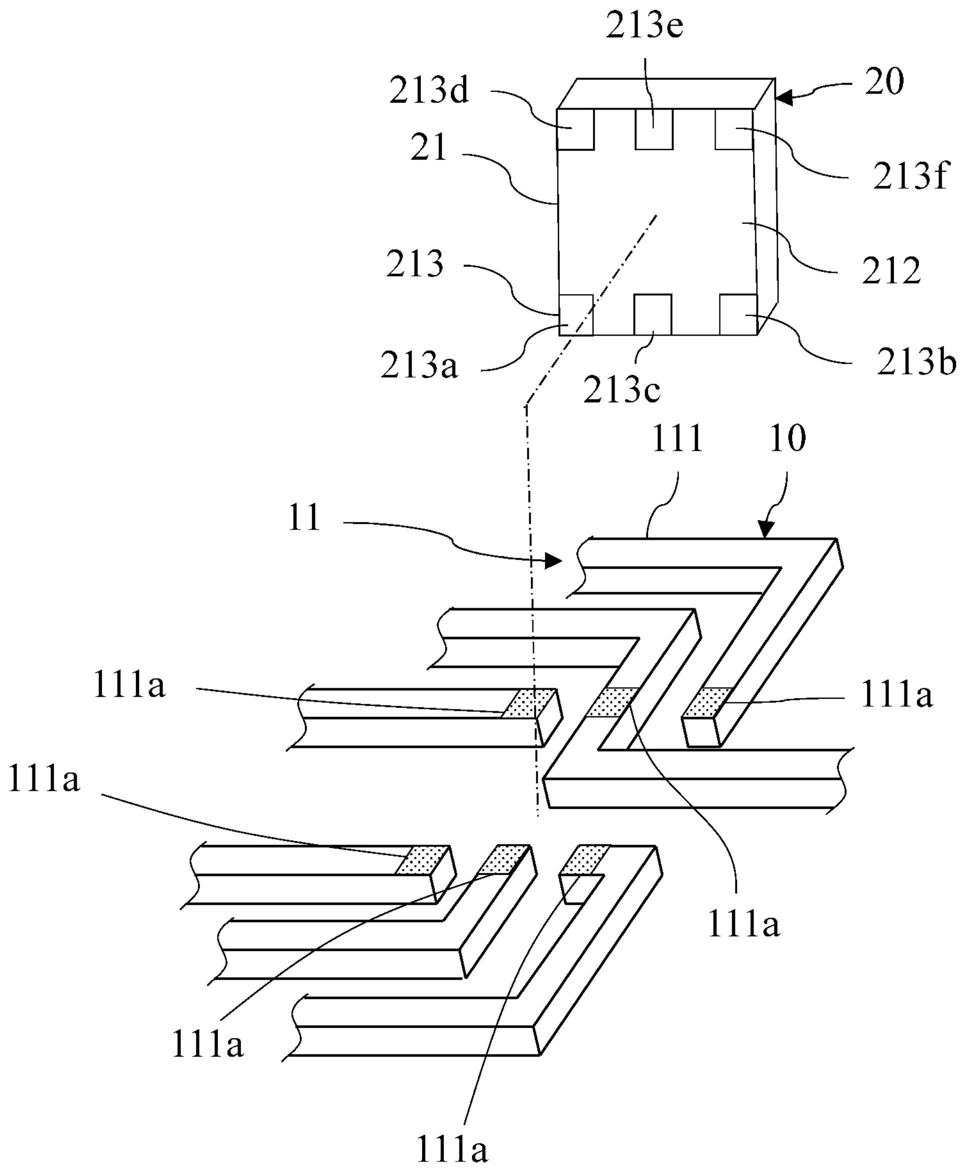
FIG. 4 is an exploded view of the structure shown in FIG. 3.
Figure 5:
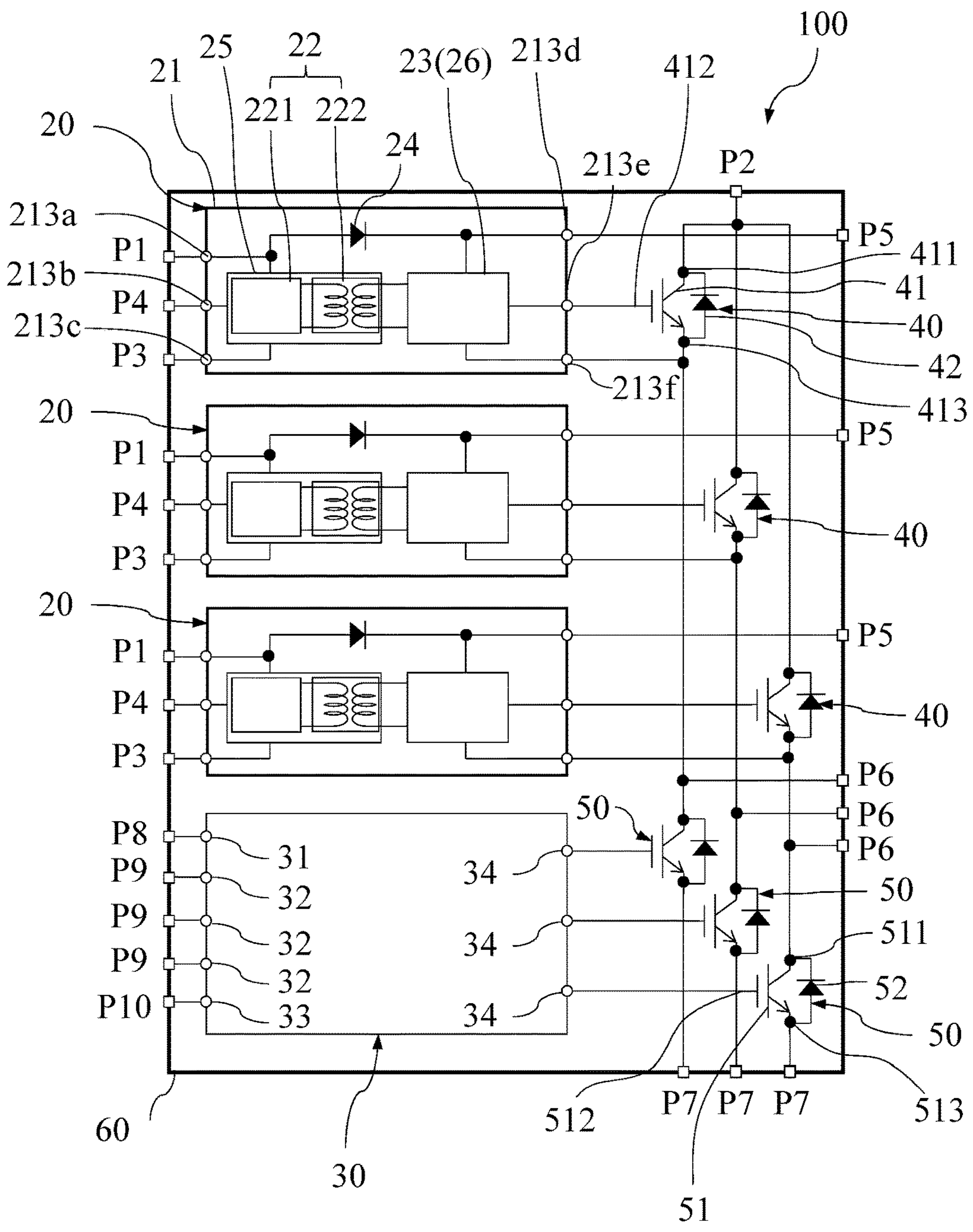
FIG. 5 is a schematic view showing a circuit diagram of the driving device according to the embodiment of the present invention.
Figure 6:
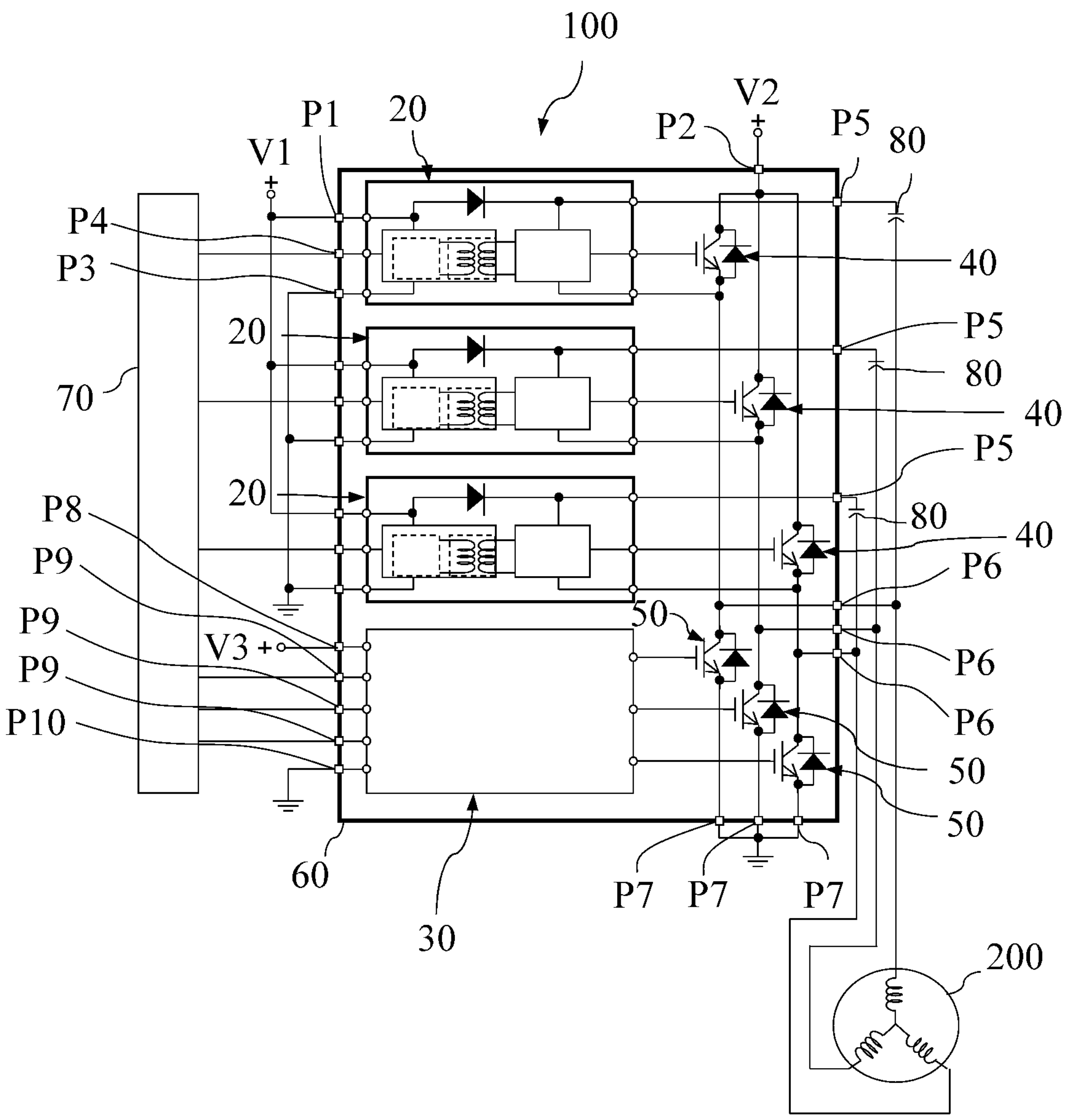
FIG. 6 is a schematic view showing the circuit diagram of the external connection of the driving device shown in FIG. 5

The three high-side driving modules 20 are respectively disposed in the high-side driving regions 11 of the lead frame 10. Each of the three high-side driving modules 20 includes a built-in package 21, a primary-side circuit 22, a drive-side circuit 23, and a bootstrap diode 24. The built-in package 21 packages the primary-side circuit 22, the drive-side circuit 23, and the bootstrap diode 24. As shown in FIG. 3 and FIG. 4, the built-in package 21 has a top surface 211 and a bottom surface 212. The bottom surface 212 is provided with a plurality of leads 213, wherein the leads 213 are electrically connected to the primary-side circuit 22, the drive-side circuit 23, and the bootstrap diode 24. The bottom surface 212 of each of the high-side driving modules 20 faces each of the high-side driving regions 11 of the lead frame 10. The leads 213 of each of the high-side driving modules 20 are correspondingly welded to each of the high-side driving regions 11 of the lead frame 10, wherein the leads 213 respectively correspond to the contacts 111*a* of the high-side linkages 111. In the current embodiment, the primary-side circuit 22 includes a control circuit 221 and an isolation circuit 222, wherein the isolation circuit 222 is configured to electrically isolate the control circuit 221 from the drive-side circuit 23, thereby preventing the drive-side circuit 23 from being affected by a high voltage of the control circuit 221.

In the current embodiment, the number of the built-in package 21 corresponds to the number of the high-side driving modules 20 to be three; the leads 213 of each of the built-in packages 21 are internal leads that are structures located on a bottom of a package body and not extending outward from the package body. However, the configuration of the built-in packages 21 is not limited thereto. In other embodiments, the configuration of the built-in packages 21 could be, for example, a Small Out-Line Package (SOP).

Referring to FIG. 2, in the current embodiment, the driving device 100 further includes a plurality of external leads, wherein the external leads include a plurality of external first power leads P1, an external second power lead P2, a plurality of external first ground leads P3, a plurality of external high-side signal-input leads P4, a plurality of external connection leads P5, a plurality of external drive-output leads P6, and a plurality of external second ground leads P7. The external first power leads P1 are connected to a first power V1. The external second power lead P2 is connected to a second power V2. The external high-side signal-input leads P4 are connected to a microcontroller 70. The external first ground leads P3 are grounded. Each of the external connection leads P5 is electrically connected to a bootstrap capacitor 80. Each of the external drive-output leads P6 is electrically connected to each of the bootstrap capacitors 80 and the three-phase motor 200. The external second ground leads P7 are grounded. The numbers of the external first power leads P1, the external first ground leads P3, the external high-side signal-input leads P4, the external connection leads P5, the external drive-output leads P6, and the external second ground leads P7 could be adjusted to correspond to the number of the phase of the motor driven by the driving device 100.

Moreover, each of the three high-side driving modules 20 further has a first chip 25 and a second chip 26, wherein the first chip 25 has the primary-side circuit 22, and the second chip 26 has the drive-side circuit 23. The primary-side circuit 22 is electrically connected to the drive-side circuit 23. An anode of the bootstrap diode 24 is electrically connected to the primary-side circuit 22, and a cathode of the bootstrap diode 24 is electrically connected to the drive-side circuit 23.

Referring to FIG. 1, in the current embodiment, the structure and the function of the three high-side driving modules 20 are identical. In order to illustrate easily, one of the high-side driving modules 20 is used for illustration. The number of the leads 213 of the built-in package 21 is six, but not limited thereto. The six leads 213 are an internal first power lead 213*a*, an internal high-side signal-input lead 213*b*, an internal first ground lead 213*c*, an internal second power lead 213*d*, an internal high-side signal-output lead 213*e*, and an internal second ground lead 213*f*. The internal first power lead 213*a* is electrically connected to the primary-side circuit 22 and the anode of the bootstrap diode 24. The internal first power lead 213*a* is directly connected to the external first power lead P1 through one of the high-side linkages 111 that is corresponding. The internal high-side signal-input lead 213*b* is electrically connected to the primary-side circuit 22. More specifically, the internal high-side signal-input lead 213*b* is electrically connected to the control circuit 221 of the primary-side circuit 22. The internal high-side signal-input lead 213*b* is directly connected to the external high-side signal-input lead P4 through one of the high-side linkages 111 that is corresponding. The internal first ground lead 213*c* is electrically connected to the primary-side circuit 22. The internal first ground lead 213*c* is directly connected to the external first ground lead P3 through one of the high-side linkages 111 that is corresponding. The internal first ground lead 213*c* of one of the high-side driving modules 20 is connected to the internal first ground lead 213*c* of another one of the high-side driving modules 20 in a manner that the high-side linkage 111 corresponding to the internal first ground lead 213*c* of the high-side driving module 20 is connected to the connection linkage 12. The internal second power lead 213*d* is electrically connected to the cathode of the bootstrap diode 24 and the external connection lead P5. The internal high-side signal-output lead 213*e* is electrically connected to the drive-side circuit 23 and one of the high-side switching modules 40 that is corresponding. Additionally, in the current embodiment, the external leads of the driving device 100 further include a plurality of external high-side signal-output leads PO1 and a plurality of external fourth ground leads PO2. Each of the internal high-side signal-output leads 213*e* is connected to each of the external high-side signal-output leads PO1 through the corresponding high-side linkages 111 to detect an output signal of each of the high-side driving modules 20. The internal second ground lead 213*f* is electrically connected to the drive-side circuit 23, the corresponding high-side switching module 40, the low-side switching module 50, and the external drive-output lead P6. The internal second ground lead 213*f* of each of the high-side driving modules 20 is connected to each of the external fourth ground leads PO2 through the corresponding high-side linkages 111 to detect the output signal of each of the high-side driving modules 20. The external leads are connected to the corresponding high-side linkages 111 in a manner of integral connection. In the current embodiment, by the bootstrap diodes 24 and the bootstrap capacitors 80, a voltage of the three-phase motor 200 during switching phases could be increased, thereby achieving the purpose of accelerating the process of switching phases of the three-phase motor 200.

Additionally, in the current embodiment, the driving device 100 further includes an external third power lead P8, three external low-side signal-input leads P9, and an external third ground lead P10. The external third power lead P8 is connected to a third power V3. The external low-side signal-input leads P9 are connected to the microcontroller 70. The external third ground lead P10 is grounded. In the current embodiment, the number of the external low-side signal-input leads P9 corresponds to the number of the phases of the motor driven by the driving device 100.

In the current embodiment, the number of the at least one low-side driving module 30 is one, but not limited thereto. The low-side driving module 30 is disposed in the low-side driving region 13 of the lead frame 10. The low-side driving module 30 includes an internal power contact 31, three internal low-side signal-input contacts 32, an internal ground contact 33, and a plurality of internal low-side signal-output contacts 34. The internal power contact 31 is connected to the external third power lead P8 through one of the low-side linkages 131 that is corresponding. The three internal low-side signal-input contacts 32 are connected to the external low-side signal-input leads P9 through multiple of the low-side linkages 131 that are corresponding. The internal ground contact 33 is connected to the external third ground lead P10 through one of the low-side linkages 131 that is corresponding. The internal low-side signal-output contacts 34 are electrically connected to the low-side switching modules 50 that are corresponding. The number of the internal low-side signal-input contacts 32 and the number of the internal low-side signal-output contacts 34 respectively correspond to the number of the phase of the driven motor.

Additionally, in the current embodiment, the driving device 100 further includes a plurality of external low-side signal-output leads PO3, wherein the external low-side signal-output leads PO3 are connected to the low-side linkages 131, which are corresponding to the internal low-side signal-output contacts 34, to detect an output signal of the low-side driving module 30. The external low-side signal-output leads PO3 are connected to the low-side linkages 131, which are corresponding to the internal low-side signal-output contacts 34, in a manner of integral connection.

The high-side switching modules 40 are respectively disposed in the high-side switching regions 14 of the lead frame 10. In the current embodiment, the structure and the function of the three high-side switching modules 40 are identical. In order to illustrate easily, one of the high-side switching modules 40 is used for illustration. The high-side switching module 40 includes a first transistor 41 and a first diode 42. The first transistor 41 has a first end 411, a second end 412, and a third end 413. The first end 411 is electrically connected to the external second power lead P2 and a cathode of the first diode 42. The second end 412 is electrically connected to the internal high-side signal-output lead 213*e* through one of the high-side linkages 111 and one of the high-side metal wires 112 of the lead frame 10 that are corresponding. The third end 413 is electrically connected to an anode of the first diode 42, one of the external drive-output leads P6 that is corresponding, and is electrically connected to the internal second ground lead 213*f* through one of the high-side linkages 111 and one of the high-side metal wires 112 of the lead frame 10 that are corresponding. In the current embodiment, the first transistor 41 of each of the high-side switching modules 40 is an insulated-gate bipolar transistor, wherein the first end 411 is a collector of the insulated-gate bipolar transistor, the second end 412 is a gate of the insulated-gate bipolar transistor, and the third end 413 is an emitter of the insulated-gate bipolar transistor. In other embodiments, the first transistors 41 of the high-side switching modules 40 could be a switching element, such as a bipolar transistor or a metal-oxide-semiconductor field-effect transistor.

The three low-side switching modules 50 are respectively disposed in the low-side switching regions 15 of the lead frame 10. In the current embodiment, the structure and the function of the three low-side switching modules 50 are identical. In order to illustrate easily, one of the low-side switching modules 50 is used for illustration. The low-side switching module 50 includes a second transistor 51 and a second diode 52. The second transistor 51 has a fourth end 511, a fifth end 512, and a sixth end 513. The fourth end 511 is electrically connected to the third end 413 of the first transistor 41, a cathode of the second diode 52, and one of the external drive-output leads P6 that is corresponding. The fifth end 512 is electrically connected to one of the internal low-side signal-output contacts 34, which is corresponding, through one of the low-side linkages 131 and one of the low-side metal wires 132 of the lead frame 10 that are corresponding. The sixth end 513 is electrically connected to an anode of the second diode 52 and one of the external second ground leads P7 that is corresponding. In the current embodiment, the second transistor 51 of each of the low-side switching modules 50 is an insulated-gate bipolar transistor, wherein the fourth end 511 is a collector of the insulated-gate bipolar transistor, the fifth end 512 is a gate of the insulated-gate bipolar transistor, and the sixth end 513 is an emitter of the insulated-gate bipolar transistor. In other embodiments, the second transistors 51 of the low-side switching modules 50 could be a switching element such as a bipolar transistor or a metal-oxide-semiconductor field-effect transistor.

The outer package 60 packages the high-side driving modules 20, the low-side driving module 30, the high-side switching modules 40, the low-side switching modules 50 and the lead frame 10.

In other embodiments, the number of the at least one low-side driving module 30 could be adjusted to three without integration to meet different requirements and then the number of the at least one low-side driving region 13 is correspondingly adjusted, as long as the number of the low-side driving module 30 and the number of the low-side driving region 13 correspond to the number of the phases of the motor driven by the driving device 100. In practice, the number of the external second ground lead P7 could be at least one, wherein the at least one external second ground lead P7 is connected to the second transistors 51 and the second diodes 52 through a plurality of metal wires.

With the aforementioned design, each of the high-side driving modules 20 includes the built-in package 21 to packages the primary-side circuit 22, the drive-side circuit 23, and the bootstrap diode 24, so that the driving device 100 of the present invention achieves that each of the high-side driving modules 20 forms an individual component. In this way, before the outer package 60 packages, each of the high-side driving modules 20 could be inspected in advance for troubleshooting. When any one of the high-side driving modules 20 is found malfunctioned during inspection, only the malfunctioned high-side driving module 20 is required to be replaced, thereby reducing the cost due to malfunction. Moreover, as each of the high-side driving modules 20 forms an individual component, the problem of the conventional power module that the yield rate of packaging is decreased and the packaging time is increased by integrally packaging three high-side driving circuits could be relieved.

It must be pointed out that the embodiments described above are only some preferred embodiments of the present invention. All equivalent structures which employ the concepts disclosed in this specification and the appended claims should fall within the scope of the present invention.

What is claimed is:

1. A driving device, comprising:

a lead frame having a plurality of high-side driving regions, at least one low-side driving region, a plurality of high-side switching regions, and a plurality of low-side switching regions;

a plurality of high-side driving modules respectively disposed in the plurality of high-side driving regions of the lead frame, wherein each of the plurality of high-side driving modules comprises a built-in package, a primary-side circuit, a drive-side circuit, and a bootstrap diode; the built-in package packages the primary-side circuit, the drive-side circuit, and the bootstrap diode; the built-in package has a top surface and a bottom surface; the bottom surface is provided with a plurality of leads, wherein the plurality of leads are electrically connected to the primary-side circuit, the drive-side circuit, and the bootstrap diode; the bottom surface of each of the plurality of high-side driving modules faces each of the plurality of high-side driving regions of the lead frame; the plurality of leads of each of the plurality of high-side driving modules are welded to each of the plurality of high-side driving regions of the lead frame;

at least one low-side driving module disposed in the at least one low-side driving region of the lead frame;

a plurality of high-side switching modules respectively disposed in the plurality of high-side switching regions of the lead frame; wherein each of the plurality of high-side switching modules is electrically connected to each of the plurality of high-side driving modules through the lead frame;

a plurality of low-side switching modules respectively disposed in the plurality of low-side switching regions of the lead frame, wherein the plurality of low-side switching modules are electrically connected to the at least one low-side driving module through the lead frame; and an outer package packaging the plurality of high-side driving modules, the at least one low-side driving module, the plurality of high-side switching modules, the plurality of low-side switching modules, and the lead frame.

2. The driving device as claimed in claim 1, wherein each of the plurality of high-side driving regions comprises a plurality of high-side linkages; the plurality of high-side linkages are arranged at intervals; each of the plurality of high-side linkages has a contact; each of the plurality of leads of each of the plurality of high-side driving modules is welded to the contact of each of the plurality of high-side linkages.

3. The driving device as claimed in claim 2, wherein each of the plurality of high-side switching modules is connected to multiple of the plurality of high-side linkages of each of the plurality of high-side driving regions through a plurality of high-side metal wires.

4. The driving device as claimed in claim 1, wherein the at least one low-side driving region comprises a plurality of low-side linkages and at least one die pad; the plurality of low-side linkages are arranged at intervals; the at least one low-side driving module is disposed on the at least one die pad; the at least one low-side driving module is respectively connected to the plurality of low-side switching modules and the plurality of low-side linkages through a plurality of low-side metal wires.

5. The driving device as claimed in claim 1, wherein each of the plurality of high-side driving modules has a first chip and a second chip; the first chip has the primary-side circuit; the second chip has the drive-side circuit; the primary-side circuit is electrically connected to the drive-side circuit; the bootstrap diode is electrically connected to the primary-side circuit and the drive-side circuit.

6. The driving device as claimed in claim 2, further comprising a plurality of external leads, wherein the plurality of external leads comprise a plurality of external first power leads, a plurality of external high-side signal-input leads, and a plurality of external first ground leads; the lead frame comprises a connection linkage, wherein the connection linkage is connected to one of the plurality of high-side linkages of each of the plurality of high-side driving regions; the plurality of leads of each of the plurality of high-side driving modules comprise an internal first power lead, an internal high-side signal-input lead, and an internal first ground lead; the internal first power lead is electrically connected to the primary-side circuit; the internal first power lead of each of the plurality of high-side driving modules is connected to each of the plurality of external first power leads through one of the plurality of high-side linkages that is corresponding to the internal first power lead; the internal high-side signal-input lead is electrically connected to the primary-side circuit; the internal high-side signal-input lead of each of the plurality of high-side driving modules is connected to each of the plurality of external high-side signal-input leads through one of the plurality of high-side linkages that is corresponding to the internal high-side signal-input lead; the internal first ground lead of each of the plurality of high-side driving modules is electrically connected to the primary-side circuit; the internal first ground lead of each of the plurality of high-side driving modules is connected to each of the plurality of external first ground leads through one of the plurality of high-side linkages that is corresponding to the internal first ground lead; the internal first ground lead of each of the plurality of high-side driving modules is electrically connected to the internal first ground lead of others of the plurality of high-side driving modules through the connection linkage and the high-side linkage corresponding to the internal first ground lead.

7. The driving device as claimed in claim 2, further comprising a plurality of external leads, wherein the plurality of external leads comprise a plurality of external connection leads; the plurality of external connection leads are configured to be electrically connected to a plurality of bootstrap capacitors; the plurality of leads of each of the plurality of high-side driving modules comprise an internal second power lead; the internal second power lead of each of the plurality of high-side driving modules is electrically connected to the bootstrap diode of each of the plurality of high-side driving modules and is connected to each of the plurality of external connection leads through one of the plurality of high-side linkages that is corresponding.

8. The driving device as claimed in claim 7, wherein the plurality of external leads comprise an external second power lead and a plurality of external drive-output leads; the plurality of leads of each of the plurality of high-side driving modules comprise an internal high-side signal-output lead; each of the plurality of high-side switching modules comprises a first transistor and a first diode; the first transistor has a first end, a second end, and a third end; the first end is electrically connected to the external second power lead and the first diode; the second end is electrically connected to the internal high-side signal-output lead of one of the plurality of high-side driving modules through a high-side metal wire and one of the plurality of high-side linkages; the third end is electrically connected to the first diode and one of the plurality of external drive-output leads; two ends of each of the plurality of bootstrap capacitors are respectively and electrically connected to each of the plurality of external connection leads and each of the plurality of external drive-output leads.

9. The driving device as claimed in claim 8, wherein the plurality of external leads comprises at least one external second ground lead; the at least one low-side driving module has a plurality of internal low-side signal-output contacts; each of the plurality of low-side switching modules comprises a second transistor and a second diode; the second transistor has a fourth end, a fifth end, and a sixth end; the fourth end is electrically connected to the second diode, one of the plurality of external drive-output leads, and the third end of the first transistor of one of the plurality of high-side switching modules that is corresponding; the fifth end is electrically connected to one of the plurality of internal low-side signal-output contacts; the sixth end is electrically connected to the second diode and the at least one external second ground lead.

10. The driving device as claimed in claim 9, wherein the plurality of leads of each of the plurality of high-side driving modules comprise an internal second ground lead; the internal second ground lead is electrically connected to the drive-side circuit; the internal second ground lead of each of the plurality of high-side driving modules is electrically connected to the third end of the first transistor of each of the plurality of high-side switching modules through a high-side metal wire and one of the plurality of high-side linkages that is corresponding.

11. The driving device as claimed in claim 10, wherein the plurality of external leads comprise a plurality of external output leads, the internal high-side signal-output lead and the internal second ground lead of each of the plurality of high-side driving modules are respectively connected to two of the plurality of external output leads through two of the plurality of high-side linkages that are corresponding.

* * * * *